Oct. 7, 1969 J. D. HELMS 3,470,612

METHOD OF MAKING MULTILAYER CIRCUIT BOARDS

Filed Nov. 14, 1966 4 Sheets-Sheet 1

John D. Helms,
Inventor,
Koenig, Senniger, Powers and Leavitt,
Attorneys.

United States Patent Office 3,470,612
Patented Oct. 7, 1969

3,470,612
METHOD OF MAKING MULTILAYER CIRCUIT BOARDS

John D. Helms, Dallas, Tex., assignor to Texas Instruments Incorporated, Dallas, Tex., a corporation of Delaware Filed Nov. 14, 1966, Ser. No. 594,160
Int. Cl. H05k 3/20
U.S. Cl. 29—593 2 Claims

ABSTRACT OF THE DISCLOSURE

This invention relates to circuit boards and to methods for manufacturing such circuit boards, and with regard to certain more specific features to improved means forming feed-through connections between conductive means on substrates; wherein substrates having preformed standardized circuit patterns thereon may be used, or the circuit patterns on individual substrates can be formed with the same strip material used for forming feed-through connections.

Among the several objects of the invention may be noted the provision of methods for making highly reliable interconnections between circuit paths on various layers of multilayer circuit boards, and to such methods wherein the interconnections can be individually and nondestructively tested at the time they are made; the provision of methods for manufacturing multilayer circuit boards wherein the production cycle between design and production stages are comparatively short; the provision of methods for manufacturing multilayer circuit boards which permit the use of standardized substrates and thereby eliminate the need for special art work previously required for each layer of a circuit board and for each different circuit board; the provision of methods for manufacturing multilayer circuit boards wherein optimum component placement and point-to-point connections can be determined by computer operation; the provision of methods for manufacturing multilayer circuit boards by a dry process requiring no liquids as for plating, or the like; the provision of methods for manufacturing multilayer circuit boards whereby even small quantities of circuit boards can be economically produced; the provision of methods for manufacturing circuit boards wherein the various assembly operations can be completed at a single work station; the provision of a method for interconnecting layers of multilayer circuit boards without forming connection joints within the boards; the provision of a method for manufacturing a multilayer circuit board using prepared substrates and flexible conductors only; the provision of a circuit board on which connector receptacles, pins, tube sockets and electronic components can be mounted directly on the board; and the provision of a multilayer circuit board which is conveniently repairable. Other objects and features will be in part apparent and in part pointed out hereinafter.

Present multilayer circuit boards may be manufactured by etching circuit patterns in conductive sheets or foils on insulating substrates, the patterns being unique for the particular circuit board being manufactured. These patterns on the surface of the substrates form longitudinal and transverse circuit paths which are referred to as being on X and Y axes. The circuit board has holes formed therethrough which pass through portions of the circuit patterns on the substrates that are to be interconnected when the substrates are assembled one above another. In one prior art method interconnections between the patterns on the various substrates (referred to as the Z axis connections) are formed by first sensitizing the inside surface of the holes to accept a metal plating and thereafter plating the holes with copper or other metals. This process does not always produce satisfactory connections between layers and it does not provide a connection which can be readily tested except as part of the entire circuit formed by the circuit board interconnections. When the substrate holes are formed by drilling, some of the substrate insulating material may smear onto adjacent portions of the metal pattern and prevent good electrical contact by the plated metal and the pattern on the substrate. Plated hole connections are also prone to failure, due to the stress in the complete circuit board, and they necessarily require immersion of the board in a liquid during plating.

A second prior art method for forming interconnections on the so-called Z axis perpendicular to the plane of a circuit board is by a build-up process wherein a layer of metal is formed on a substrate and etched in two steps, the first etching step producing a pattern of conductive posts for making Z-axis connections and the second step forming a pattern in the X–Y plane of the board. Then a layer of dielectric material is slumped over the patterns, partially cured and ground to expose the tops of the posts. The process is repeated until the desired number of layers are formed. In other instances, rigid pins, eyes or the like are used to form the circuit connections between layers on a circuit board, requiring considerable detailed and time-consuming artwork. Therefore, long lead times are required for the manufacture of a board. This results in high cost which can be justified only when large quantities of identical circuit boards are being manufactured.

In manufacturing multilayer circuit boards, one of the most important considerations is the forming of highly reliable direct connections between circuit patterns on layers of the board. The methods of the invention provide highly reliable interconnections in all three directions and produce these connections in such a way that standardized off-the-shelf materials may be used in connection with computer-controlled design and mechanized assembly techniques. The lead time is substantially shortened and the cost is reduced so that even low-quantity production runs are economically feasible.

The invention is summarized as follows: Using a plurality of matrixes or substrates, circuit boards of the invention are manufactured by forming conductive connections through first one layer or substrate and then through the next higher layer or substrate and interconnecting certain of the through connections, thereby to form crossover or connections between circuitry on the substrates. In one embodiment of the invention the substrates have standardized circuit patterns formed on one or both faces thereof and the through connections between layers are made by welding flexible ribbons to the patterns and interconnecting the ribbons. In another embodiment the circuit patterns on the substrates and connections between substrates are formed by conductive wires, ribbons or the like which extend both across the surface of the substrate and between layers of the substrate.

The invention accordingly comprises the constructions and methods hereinafter described, the scope of the invention being indicated in the following claims.

In the accompanying drawings, in which several of various possible embodiments of the invention are illustrated, FIGURES 1–4 are fragmentary plan views of individual standardized substrates which may be used in manufacturing circuit boards of the invention;

Corresponding reference characters indicate corresponding parts throughout the several views of the drawings.

Figures 1, 2, 3, 4:
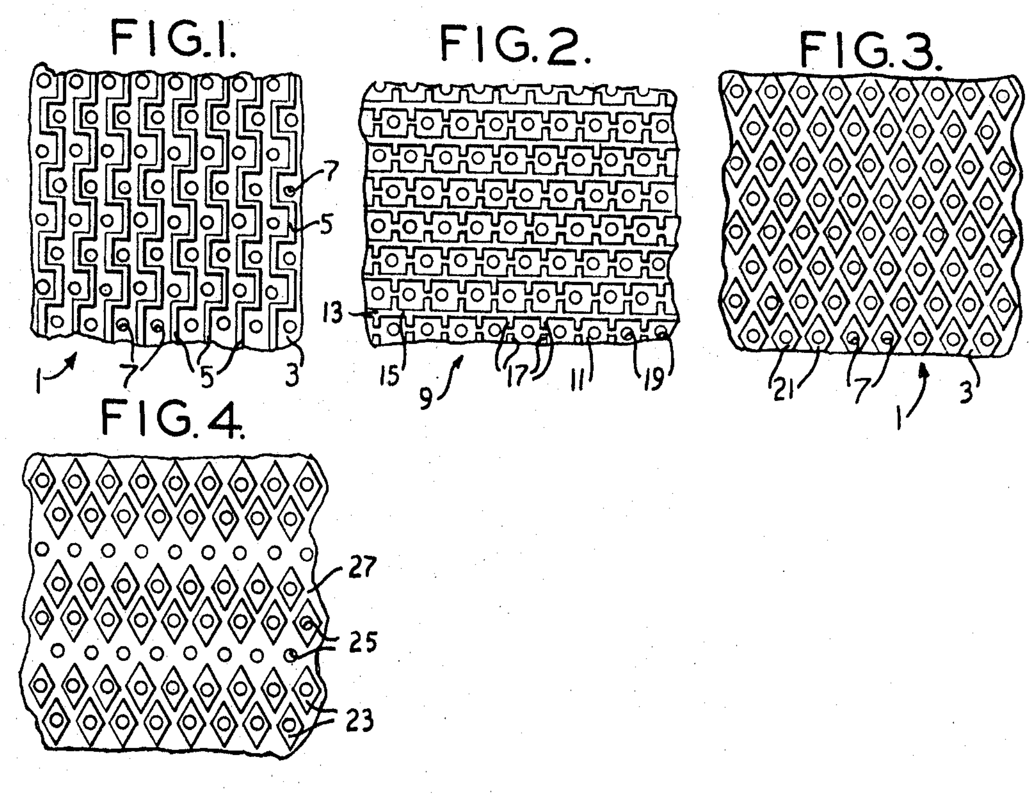

FIGURES 1–4 illustrate typical standardized conductive circuit patterns which may be formed on the surfaces of substrates according to one method of the invention. FIGURES 1 shows a substrate generally designated 1 which comprises a thin sheet 3 of electrical insulating material and a thin circuit pattern of conductive material designated 5. The pattern shown comprises a plurality of zigzag bars which extend longitudinally of the substrate alongside and between holes 7 in the substrates. The conductive pattern 5 may be formed of any suitable electrically conductive material, such as copper or nickel, and may be placed on the substrate by plating, by etching patterns in sheets of metal foil on the surfaces of the substrate, or by other known procedures.

The arrangement and number of holes 7 in the substrate are variable. By way of example the holes are shown aligned longitudinally and transversely. A substrate approximately 12 inches by 24 inches may contain about 5,000 holes having their centers spaced apart about 0.1 inch as measured from top to bottom in FIGURE 1 and about 0.05 inch between centers of holes as measured from left to right in FIGURE 1. The hole spacing is preferably the same for all of the substrates of a circuit board.

The substrate shown in FIGURE 2 and generally designated 9 comprises a sheet 11 of electrical insulating material and a thin conductive circuit pattern 13. The pattern 13 comprises a plurality of spaced strips 15 which extend transversely across the substrate between holes 19 in adjacent transversely extending rows of holes and a plurality of staggered bars 17 which project oppositely from the main body or strip of the conductive material between adjacent holes in the transverse rows of holes. Thus the pattern 13 of the FIGURE 2 substrate is substantially perpendicular to the pattern 5 of the FIGURE 1 substrate when the substrates are properly placed one above another in a multilayer circuit board. One of the circuit patterns (e.g., pattern 5) constitutes the means for forming interconnections along a longitudinal axis and the other circuit pattern (e.g. pattern 13) constitutes means for forming interconnections along a transverse axis of the circuit board. The conductive material comprising patterns 5 and 13 is preferably spaced from the holes 7 and 19 so that the conductive ribbons or members described later which provide interconnections between substrates or layers of the circuit board do not necessarily connect patterns on each layer of the circuit board. The insulating material of the substrate between the holes and the conductive patterns prevents undesired interconnections.

FIGURES 3 and 4 illustrate nondirectional circuit patterns of conductive material. FIGURE 3 shows diamond-shaped bars or pads 21 of conductive material positioned around each of the holes in a substrate. Nondirectional patterns of the type shown in FIGURE 3 are particularly useful on the back or lower surface of a multilayer board to provide a common termination pad for the conductive members which form Z-axis interconnections through one hole. Therefore, the FIGURE 3 pattern is shown on the back surface of substrate 1 although it may be on a wholly separate substrate. FIGURE 4 shows bars or pads 23 of the same diamond shape positioned around only some of the holes 25 in a substrate 27. The pattern of FIGURE 4 is preferred for the surface layer of the completed circuit board which constitutes the component attachment layer, e.g., the top surface of the board. The FIGURE 4 pattern is particularly suitable for mounting semiconductor networks on the board. It will be understood that the patterns shown in FIGURES 1–4 are only examples of suitable standardized patterns that may be formed on substrates and stocked for use in manufacturing circuit boards according to the invention.

Figure 5:
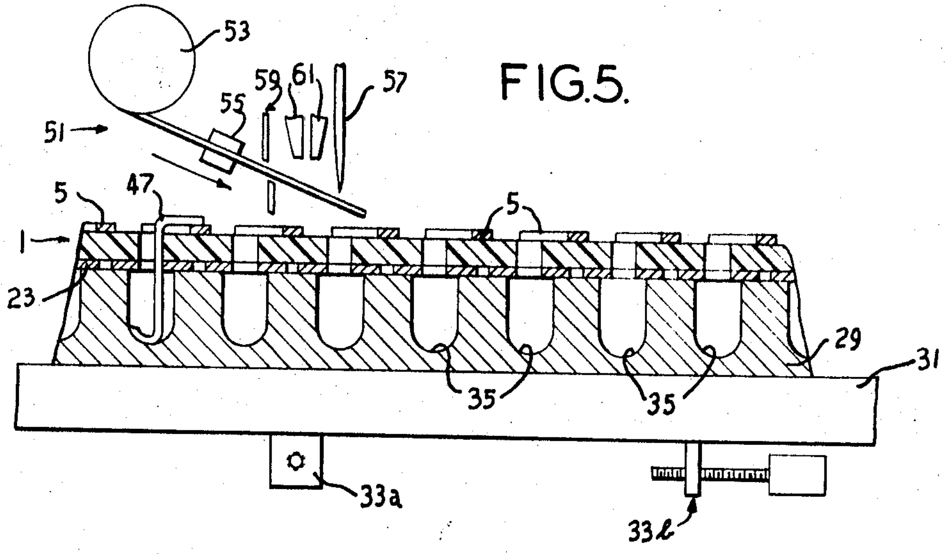
FIGURE 5 is a fragmentary section illustrating a step in the manufacture of multilayer circuit boards according to the invention.

Referring to FIGURE 5 of the drawings, a plate or fixture 29 on which a circuit board is to be constructed is placed on an X–Y positioning table 31. The table top is movable in either of two directions perpendicular to each other (i.e., in an X or Y direction) by drive means diagrammatically shown at **33*a* and 33*b*. Preferably the mechanism for moving the table is automatically controlled, such as by conventional punch-tape-operated apparatus, so that movement of the table during manufacture of the circuit board is automatic. As alternatives, the mechanisms for chiseling the circuit patterns and for inserting and welding ribbons (described later) can be mounted for movement in the X and Y directions, or the Z-axis connections can be made manually. The plate 29 has a plurality of openings 35** which are preferably arranged in the same pattern as the holes in the substrate.

Figure 6:
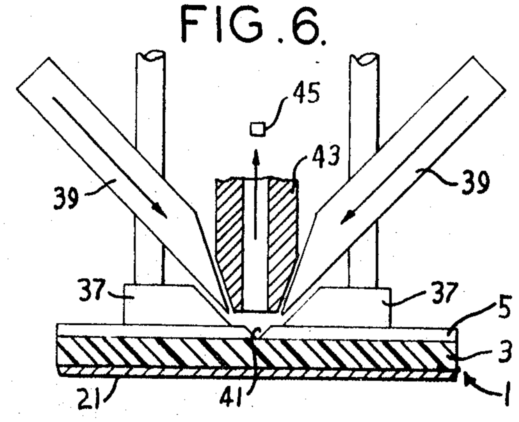
FIGURE 6 is a fragmentary view diagrammatically showing a lancing operation being preformed on a substrate.
Figure 7:
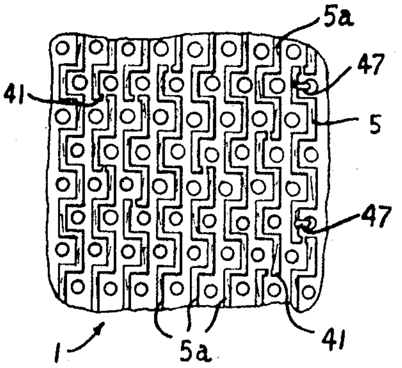
FIGURE 7 is a plan view of the FIGURE 6 substrate after the lancing step.

Substrate 1 is placed on top of plate 29 with circuit pattern 21 resting against the top of the plate and with each hole 7 in the substrate being aligned with a hole 35 in the plate. The substrate is keyed to or temporarily fastened to the plate so that it will not move relatively thereto during the subsequent forming operations. Then the conductive paths formed by pattern 5 on substrate 1 are selectively severed without damaging the sheet 3 of insulating material or leaving high-resistance shorts or residual material on the surface of the substrate. Apparatus for severing the conductive paths by a chiseling operation is diagrammatically illustrated in FIGURE 6 of the drawings. The chiseling means comprises spaced pressure contacts or feet 37 which are movable vertically into and out of engagement with the conductive pattern 5. A pair of chisels 39 move angularly in the direction shown by the arrows toward and away from the pattern 5 between the pressure contacts 37. When both chisels are moved downward they engage and remove a small chip or segment of the pattern to leave a gap 41 between portions of the bars comprising pattern 5. Preferably, a tube 43 connected to a source of vacuum has end positioned immediately above and between the chisels 39 so that as the chip of material shown at 45 is severed from the pattern 5 it is picked up and carried away from the upper surface of the substrate. In this manner each of the zigzag bars forming the pattern 5 can be segmented into a plurality of discrete circuit paths or segments such as shown at **5*a* and FIGURE 7. Each of these circuit segments is separated by a gap 41** resulting from the chiseling operation and each of these discrete paths may be connected through the adjacent holes with the circuit pattern on other layers of the board as explained more fully later.

If desired, the chip conductor segment to be removed can first be heated to soften the segment by firing short electrical impulses through this segment from the pressure contacts 37, thereby facilitating removal of the chip from the circuit pattern. The pressure contacts 37 can also be used to perform a high-resistance test to ensure electrical discontinuity at gap 41 in the circuit pattern. For example, a 100 volt potential can be applied across the severed portion of the conductor to produce either a go or no-go signal, depending upon whether the resistance at this point is above or below a specific resistance, such as one thousand megohms.

During the chiseling operation the table 31 moves longitudinally and transversely in the X and Y plane under control of the punch-tape-controlled apparatus, thereby moving the substrate 1 beneath the chiseling apparatus and holding it there while the chiseling apparatus performs the function of removing the chips 45 of the pattern. In this manner formation of the circuit segments **5*a*** is completely automated for a given circuit board construction.

Figure 8:
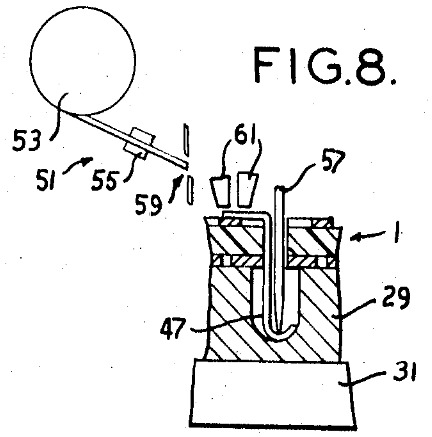
FIGURE 8 is a view similar to FIGURE 5 showing insertion and connection of ribbons on the FIGURE 1 substrate.
Figure 9:
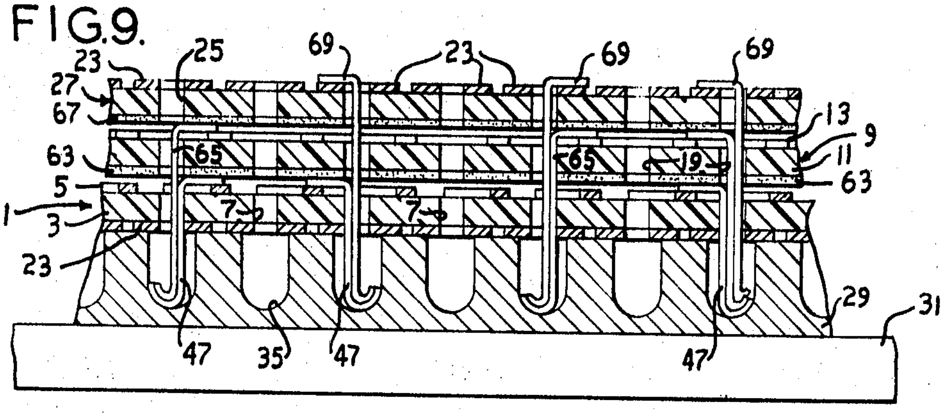
FIGURE 9 is a section similar to FIGURE 5 but showing a plurality of circuit board layers assembled one above the other.

Referring to FIGURES 5 and 8, flexible strips or ribbons 47 of electrical conductors are secured to the pattern 5 on the upper surface of the substrates and fed through the holes 7 into holes 35 and plate 29. This step may be carried out by using a feed-through and welder assembly diagrammatically shown at 51 in FIGURES 5 and 8. Assembly 51 comprises a feed reel 53 containing the flexible conductive material. A length of the material is pulled from reel 53 by a feed mechanism 55 and extended to a position beneath a needle-like punch 57. The ribbon 47 is then forced through the holes 7 and 35 by extension of the punch from its retracted position (FIGURE 5) above the surface of the substrate to its extended position (FIGURE 8) where it projects down through a hole 7 and into a hole 35 to place one end portion of the ribbon against the bottom of the hole 35. The end of the ribbon becomes looped around the needle as this occurs, as shown in FIGURE 9. When the needle reaches the bottom of hole 35 the ribbon is cut by a shearing mechanism designated 59. Then welding electrodes 61 engage the upper end portion of the ribbon and weld it to a segment **5*a* of the circuit pattern 5. This operation preferably takes place at each end portion of those pattern segments 5*a* (FIGURE 7) which are to be interconnected with other patterns or circuit components in the completed board. By way of example ribbons 47 are shown connected to end portions of some of the circuit segments 5*a* in FIGURE 7. During this operation the table 31 is moved in the X and Y directions to place the end portions of segments 5*a* beneath the welding apparatus. It will be understood that the ribbons can be connected to the pattern segments 5*a*** anywhere along their lengths.

Preferably the welding apparatus is rotatable relative to the substrate so that the ribbons can be welded to the portions of pattern 5 either directly above, below or to the sides of the holes as viewed in FIGURE 1. The welder preferably has a feedback circuit which produces a signal when a high-quality weld has been completed so that the rest of the cycle of operation will be dependent on effecting a good weld between the ribbon and the circuit pattern. In this manner each weld is independently tested at the time the welds are made and defective welds may be repaired before proceeding with assembly of the circuit board.

After the desired number of ribbons 47 have been connected to the conductive patterns 5 and fed down through the holes 7 and 35, a layer of bonding material 67 (FIGURE 9) is placed on substrate 1. The bonding material may be in the form of a sheet or it may be brushed or otherwise applied to the surface of the substrate. Then a second substrate, preferably the substrate 9, is positioned on the substrate 1 and the bonding layer 63. Holes 19 in substrate 9 are aligned with holes 7 and 35. The conductive pattern 13 on substrate 9 is then segmented by chiseling as described before in connection with FIGURE 6. Conductive ribbons 65 are passed down through holes 19, 7 and 35 and welded to segments of pattern 13. The chiseling and welding operations are the same as those described before for the substrate 1.

When one of the ribbons 65 is fed down into the same hole occupied by one of the ribbons 47, the two ribbons are secured together, preferably by welding, using the needle punch 57 as one welding electrode and the bottom of the forming plate 29 as the other welding electrode. FIGURE 9 shows certain of the ribbons welded together in this manner.

A layer of bonding material 67 is then applied to the top of substrate 9. More substrate and bonding layers can be assembled containing patterns such as shown in FIGURES 1 and 2 until the desired number of layers have been assembled one above the other. Since this merely requires a repetition of the steps previously described, only two of these substrate layers (1 and 9) have been shown in the drawings.

Next the substrate 27 of FIGURE 4 is positioned above the top bonding layer as shown in FIGURE 9. Normally it will not be necessary to chisel away or remove portions of this circuit pattern since each of the diamond-shaped bars is entirely separate or discrete, there being no interconnection between them. However, Z axis interconnections are required and these are achieved using the apparatus of FIGURES 5 and 8 in the manner previously described. Ribbons 69 are shown in the drawings for affecting this Z axis interconnection. It will be understood that ribbons 69 can be welded to ribbons 47 and/or ribbons 65 in order to connect the conductive bars or pads 23 to the desired pattern segment on the other substrates. Preferably, the welding assembly can be displayed axially as it is used with the various substrates so that the ribbons are displaced relative to each other about the circumference of the holes as they are fed down through the holes, thereby to prevent piling up of the ribbons along the sides of the holes. Because the ribbons are looped at the bottom of the holes they are in contact with the ribbons from other substrates in order to effect welding between the ribbons. Also, the welder assembly can be adjustable so that the length of the ribbon for upper substrates can be somewhat longer than those of the lower substrates to ensure that the ribbons from upper substrates reach the bottom of the holes 35.

Figure 10:
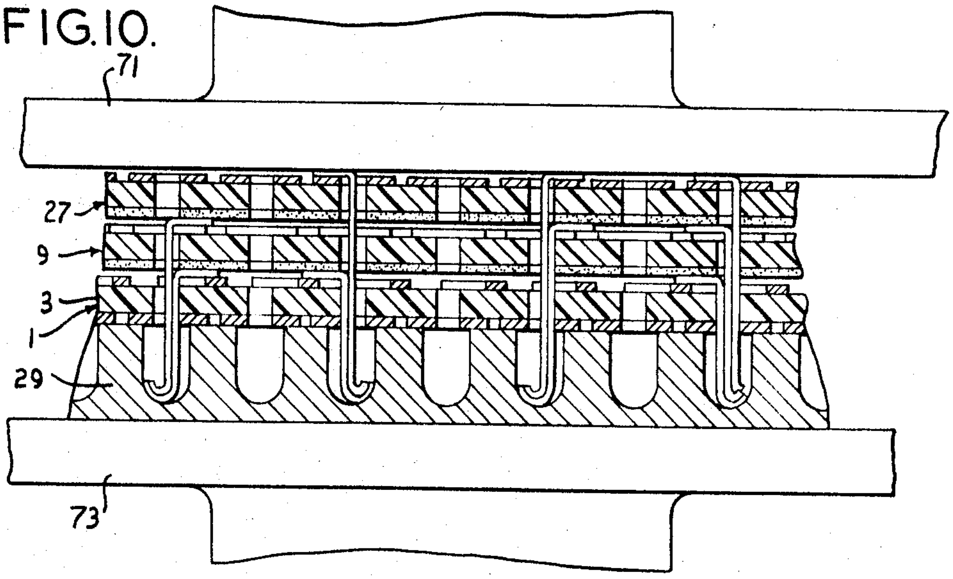
FIGURE 10 is a section showing molding of the assembled substrates.

Then the construction plate 29 and the substrates thereon are placed between the upper and lower platens 71 and 73 of a press (FIGURE 10) where the substrates are bonded together into a substantially homogeneous mass by the application of heat and pressure. During the bonding process, the layers 63 and 67 of bonding material are squeezed and adhered to the upper and lower surfaces of the adjacent substrates of the circuit board.

Insulating sheets of the various substrates may be made from suitable heat-curable materials to facilitate bonding of the substrates together into a composite block. For example, each of the sheets may be an epoxy-filled fiberglass layer about 0.007 inch thick. The bonding layers 63 and 67 may be thin sheets or films of thermosetting material, such as an epoxy base material. Each film of bonding material may have a thickness of about 0.001 inch. Since they are easily ruptured, they do not need to have a pattern of holes punched in them corresponding to the holes in the various substrates since the punch of the welder assembly will readily penetrate the bonding films.

Figure 11:
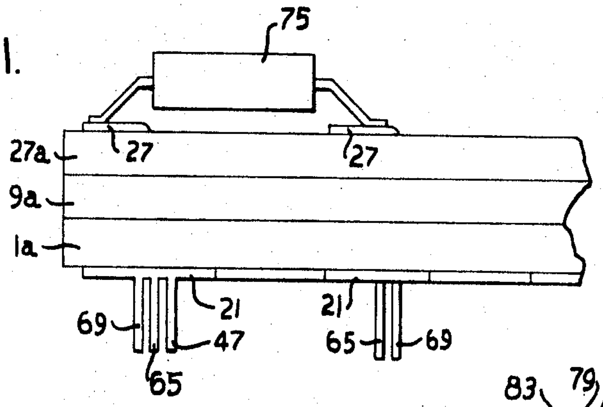
FIGURE 11 is a fragmentary elevation of a completed circuit board showing an electronic component mounted on the board.

The resulting multilayered circuit board is shown in FIGURE 11 to comprise layers **1*a*, 9*a* and 27*a* resulting from the substrate 1, 9 and 27, respectively. When the insulating sheets of the substrates are made from heat-curable materials, the various layers may be virtually indistinguishable in the resulting circuit board. The patterns 5 and 13 of conductive material on top of the substrates are embedded within the circuit board while the patterns of material 21 and 23 are exposed on the lower and upper surfaces of the circuit board. Connections are made between semiconductor networks or other electronic components 75 and the various circuit patterns of the circuit board by securing leads from the component to the diamond-shaped pads 23 which are exposed at the top surface of the circuit board as shown at FIGURE 11. As alternatives, the leads from the components can be attached to the circuit pattern 21 at the bottom of the board or to ribbons 47, 65 and 69. If the component has pins which are properly spaced and dimensioned they may be inserted directly into the holes of the circuit board and connected to the ribbons. If the ribbons 47, 65 and 69** in the same hole are not welded together during their insertion into the holes, then they may be connected together later by welding or by flow-soldering techniques.

Figure 12:
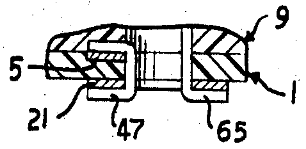
FIGURE 12 is a fragmentary section illustrating a method of interconnecting ribbons of the board.

FIGURE 12 of the drawings illustrates attachment of the ends of the ribbons of conductive material to the circuit pattern 21 at the bottom of the circuit board. Two ribbons 47 and 65 are shown connected to a common pad of the circuit pattern 21 on the lower surface of the bottom substrate by welding, soldering or other suitable means. This eliminates the need for connecting the ribbons together.

Figure 13:
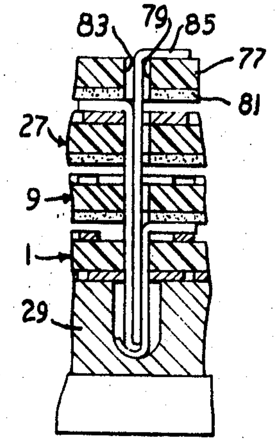
FIGURE 13 is a fragmentary section showing a modification.

FIGURE 13 of the drawings shows a modified circuit board construction wherein a finishing substrate 77 is provided comprising a sheet of insulating material with holes 79 therethrough which are positioned over and aligned with the holes in the other substrates. Substrate 77 comprises a finishing layer and it is entirely free of conductive circuit patterns. A bonding layer 81 is provided between the finishing layer and the substrate 27 so that they are firmly bonded together when subjected to the heat and pressure of a press as previously described. Connector pins or tubes 83 are provided and inserted down through the aligned holes in the finishing layer and the other substrates. The lower end portions of the pins or tubes 83 are connected to the ribbons in the same hole to provide the Z axis interconnections. A tab 85 projects laterally from the upper end of each pin and is adapted to rest on the upper surface of the finishing layer. The tabs provide means for connecting electronic components to circuitry of the circuit board. In other respects the circuit board of FIGURE 13 is the same as that previously described.

In the previously described embodiments of the invention the circuit pattern on substrates 1 and 9 is spaced from the holes, which prevents interconnection between the ribbons and every lower substrate of the board, i.e., the presence of a ribbon in a hole does not necessarily require interconnection to each lower substrate but only to the desired substrate. This contrasts with the plated hole type of interconnections previously used wherein circuit patterns necessarily go directly up to the periphery of the hole so that the plating can effect the necessary connection at each layer of the circuit board.

Interconnection between the various ribbons can also be effected by the use of a ball or pellet of solder material which is dropped into the holes and melted by a weld burst between the needle punch and the lower conductive member of the plate 29 to provide a conductive path between the various ribbons. The ribbons can also be twisted or otherwise physically connected to each other.

Figure 14:
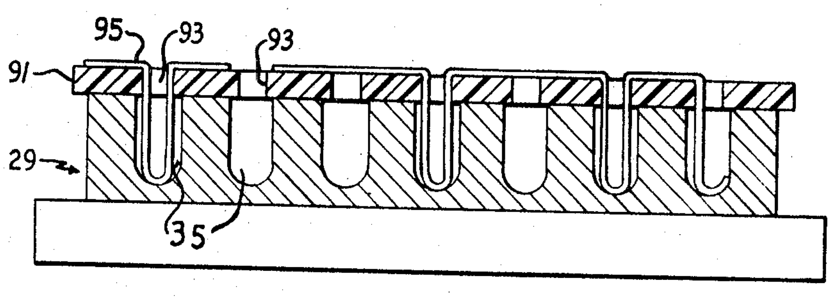
FIGURES 14 and 15 are sections illustrating manufacture of a circuit board, back panel or the like according to an alternative method of the invention.
Figure 15:
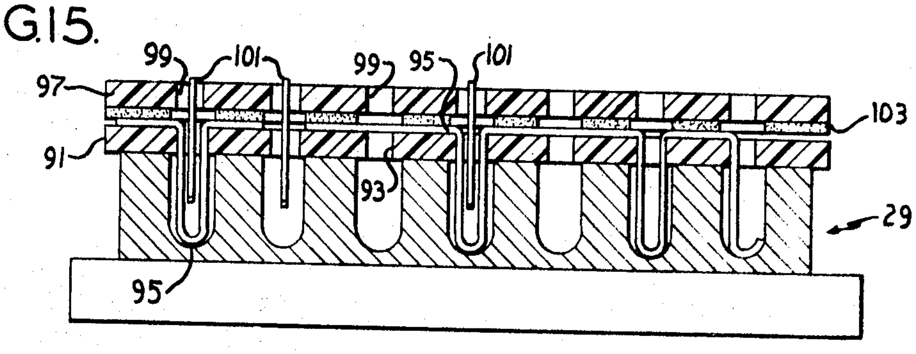

FIGURES 14–19 illustrate another embodiment of a method for manufacturing circuit boards, and this method is particularly suitable for wiring back panels used for interconnecting a plurality of other circuit boards. In this embodiment the various layers of the circuit board are formed from sheets or layers of electrical insulating material and conductive wires. Referring to FIGURE 14, the circuit board is assembled on the construction fixture 29 by first placing a substrate 91, comprising a sheet of electrical insulating material, on the upper surface of the plate and aligning holes 93 in the substrate with the holes 35 in the plate. Substrate 91 is preferably a heat-moldable material which is entirely free of circuit patterns of conductive material fixed on the substrate as shown at 5, 13, etc. in the first embodiment.

Figure 16:
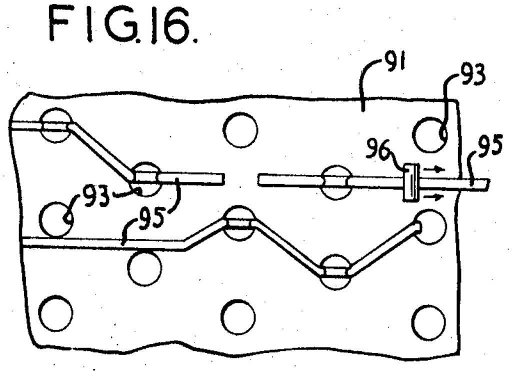
FIGURES 16 and 17 are fragmentary plan views of the substrates during the stages of manufacture of a circuit board illustrated in FIGURES 14 and 15, respectively.

A plurality of flexible wires 95 (FIGURES 14 and 16) are placed over the upper surface of substrate 91 and loops of the wires are fed through holes 93 in the substrate. Wires 95 constitute a circuit pattern on the top of the board as well as means for interconnecting this pattern with electronic components or a circuit pattern on other layers of the circuit board. The location of the wires along the top surface of the substrate will be determined by the desired circuit pattern. Preferably all wires 95 extend generally in a longitudinal direction across the substrate so that they constitute the X axis of the circuit board. The wires 95 can be bonded to the surface of a heat-curable substrate by pressing the wire against the substrate with a hot roll or the like 96 (FIGURE 16).

Figure 17:
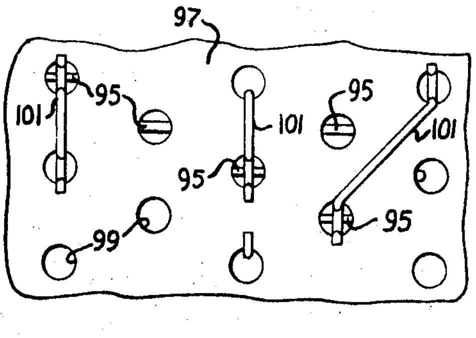

Then another substrate 97 of insulating material is positioned over the substrate 91 so that holes 99 through the second substrate are aligned with the holes 93 in the first substrate. Then flexible wires 101 (FIGURES 15 and 17) are positioned across the upper surface of substrate 97 with loops of these wires being punched down through these holes 99, 93 and 35 at places where it is desired to interconnect wires 101 with the wires 95 to effect crossovers, or to connect the wires with electronic components. As shown in FIGURE 17 the wires 101 preferably extend across the substrate 97 in a direction crosswise to the wires 95, that is, along the Y axis of the circuit board. The Z or vertical axis connections through the circuit board are made by interconnecting wires 95 and 101.

The desired number of substrates are assembled one above the other and circuit patterns are formed on the substrates by the wires on top of the substrates and punched down through holes in the substrates. A layer or film of bonding material designated 103 in FIGURE 15 can be provided between adjacent layers of the circuit board to facilitate bonding of these layers together. If desired, the upper layer of the circuit board may be a substrate 105 (FIGURE 18) having holes 107 through it aligned with holes 99. Ordinarily there are no conductors on substrate 105. This substrate is similar to the substrate 77 previously described. Then the plate 29 with the substrates on it is positioned between platens of a press (as shown at 73 and 75 in FIGURE 10) and the various layers are bonded together by the application of heat and pressure. The resulting circuit board contains layers generally designated **91*a*, 97*a* and 105 in FIGURE 16 which are formed by the substrates 91, 97 and 105. The portions of the conductive wires 95 and 101** which were placed on top of the substrates are embedded in the board and the loops which were fed through the substrates are exposed at the bottom of the board.

Electronic components 109 can be positioned on the completed board with the terminals or pins 111 of the components extending through holes in the various substrate layers and out beneath the bottom surface of the circuit board. The leads 111 are welded or soldered to the projecting loops of the wires 95 and 101 to form circuits including the components. The wires 95 and 101 in common holes are connected to each other by welding, soldering or twisting the wires together, thereby interconnecting circuitry on one layer of the circuit board with circuitry on another layer of the circuit board.

Figure 18:
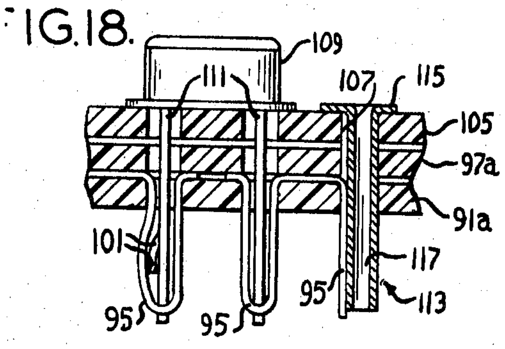
FIGURE 18 is a fragmentary section showing a completed circuit board with an electronic component positioned thereon.

Other means can be provided for connecting circuitry on the various levels of the circuit board with each other or with electronic circuit components. For example, a connector tube or receptacle 113 (FIGURE 18) can be positioned in holes in the circuit board. Connector 113 has a rim portion 115 positioned at the top surface of the circuit board and a stem portion 117 which projects from the lower surface of the circuit board. Connector pins on electronic components can be placed in the tube or receptacle 113 or leads on the components can be connected to rim 115. The circuitry on the various layers of the circuit board can be connected to the tube 113 by passing one or more of the conductors through the same hole as the pin and welding or soldering the projecting parts of the pins and conductors together. In FIGURE 18 the tube 113 is shown connected to a conductor 95 which in turn is connected to the component 109. If wires are provided on the top of substrate 105, then semiconductor networks (or other circuit components) can be positioned on top of substrate 105 and attached directly to such wires.

Figure 19:
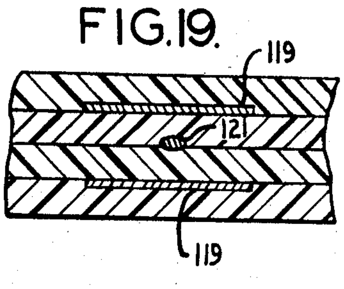
FIGURE 19 is a section showing a circuit board of the invention having shield or ground plates.

Shield or ground planes can be provided with circuit boards of the invention as shown in FIGURE 19. The shield or ground planes comprise wide stripes of conductive metal 119 on certain of the substrates. The shield planes may be used on opposite sides of round elliptical or like flattened wiring 121. Wire 121 may be a wire on a substrate of the board, such as wires 95 and 101. Communication between circuit components or other portions of the circuit and the ground planes may be provided by the use of ribbons as described in connection with FIGURES 1–13. Thus the method of FIGURES 1–13 and the method of FIGURES 14–18 may be combined in fabrication of a single circuit board.

In prior circuit boards, the Z axis interconnections made by plating through the holes in the board necessarily resulted in electrical connection entirely through the holes from the top surface of the board to the bottom surface thereof. According to the methods of the invention, this electrical connection is usually only to one surface of the board from an intermediate substrate instead of to both surfaces as in the plated-hole technique.

The preceding description of the invention has referred to the various constructions as being suitable for circuit boards and it is to be understood that this includes mother boards and back panel boards. A mother board is used for interconnecting components on a plurality of circuit boards which are attached to the mother board by conventional connector strips on the circuit boards, the connector strips comprising pins connected to circuits in the circuit boards and projecting from the boards for insertion into holes in the mother board. Similarly, back panel boards connect a plurality of mother boards. The techniques described in connection with FIGURES 14–19 are particularly suitable for back panel interconnections. Connection between a circuit board and a mother board can be established by engagement between ribbons or wires in holes of the mother board and pins from the connector strips on circuit boards.

The resistance of the various circuits in circuit boards, mother boards or the like, can be varied by using wires or circuit patterns of various resistances per unit length or by varying the total length of the circuit path.

In the various embodiments of the invention the construction is not dependent upon specific materials which can be immersed in plating solutions since it is a dry system which does not require immersion.

In the system of FIGURES 14–19 using the wires for the X, Y and Z axes connections, no joints are formed inside the board which might break or form discontinuities due to vibration or other rugged service. In the systems of FIGURES 1–13 using ribbons or wires for establishing any of the Z axis connections, each of the weld joints inside the board can be tested at the time the board is being made, to ensure good electrical connection at the joints and thereby avoiding the possibility that one or more joint or connection is faulty which, according to prior systems and methods, could only be determined after completion of the entire circuit board and all plating of through connections was completed. Thus highly reliable boards can be consistently produced according to the methods of the invention.

The circuit boards and methods of the invention are adaptable to computer design and mechanized assembly, starting with information received by the customer in conventional form, such as a point-to-point wiring list. This information is furnished to the computer together with additional information such as the maximum board size, form factors, maximum number of components to be allowed on each board, shielding requirements and connector pin spacing. Component placement input may be provided by the customer. The customer's diagram is processed through a manual signal assignment operation in which each component is identified by number and each lead is assigned an identifiable signal code. These identification numbers and signal codes are then listed for conversion to computer cards. The list may describe the board dimensions in terms of size, number of layers, number of connector pins wanted, and forbidden areas in the X–Y plane. Then cards are punched with this coded information. Using this information, the computer determines signal routing, i.e., the solving of the three-dimensional interconnection patterns to be formed by the Z axis ribbons. Information thus derived is converted to a numerical control tape which operates the apparatus at the work station, including the movement of the X–Y table and operation of the chiseling and welding functions. This computer-generated logic tape is the only item unique to a particular circuit board, the other items being standardized, off-the-shelf materials. Because it is susceptible to computerized design and mechanized assembly operations, even comparatively small quantities of circuit boards can be economically produced with very little lead time being required due to the absence of art work which normally takes a considerable period of time.

In view of the above, it will be seen that the several objects of the invention are achieved and other advantageous results attained.

What is claimed is:

1. A method of making a multilayer circuit board using a plurality of substrates each having at least one surface provided with a plurality of raised, electrically conductive bars integral with said surface and arranged in a selected pattern and each having holes therethrough in a selected pattern spaced from said conductive bars comprising:

automatically positioning a first substrate beneath a chiseling means comprising spaced pressure contacts, a pair of chisels, and a tube connected to a source of vacuum;

placing said contacts on first selected areas of said conductive bars, engaging said chisels with second selected areas located between said contacts to cut chips from said second selected areas, placing said tube in the vicinity of said second selected areas to remove said chips;

applying a voltage across said contacts to insure electrical discontinuity in said second selected areas;

automatically positioning said first substrate beneath a conductive ribbon dispensing means and punch means;

feeding a first portion of an electrically conductive ribbon from said dispensing means to a point directly above at least one of said holes, depressing said punch means to engage said ribbon and force it from the upper surface of at least one of said conductive bars on said first substrate through at least one of said holes in said substrate to the lower surface of said first substrate, removing said punch means, severing said ribbon from said dispensing means, securing the severed end of said ribbon to said upper surface of said at least one of said conductive bars;

placing a second substrate over the upper surface of said conductive bars on said first substrate and aligning holes in said first and second substrates;

securing said first and said second substrates together;

automatically positioning said first and said second substrates beneath said conductive ribbon dispensing means and punch means; and feeding a second portion of an electrically conductive ribbon from said dispensing means to a point directly above one of said holes in said second substrate, depressing said punch means to engage said ribbon and force it from the upper surface of at least one of said conductive bars on said second substrate through aligned holes in said first and second substrates to a position adjacent the lower surface of said first substrate, removing said punch means, severing said ribbon from said dispensing means, securing the severed end of said ribbon to said upper surface of said at least one of said conductive bars on said second substrate.

2. A method of making a multilayer circuit board using a plurality of preformed substrates each of which has a base member composed of an electrically insulated material and a repeating circuit pattern of electrically conductive material on at least one surface of said base member, said circuit pattern being raised with respect to the surface of said base member and integral therewith, each of said substrates also having holes through said base member in spaced relationship to said circuit pattern, the method comprising:

placing a first preformed substrate on a punched-tape-controlled apparatus;

starting said punched-tape-controlled apparatus to automatically position said first preformed substrate beneath a chiseling means consisting essentially of spaced pressure contacts, a pair of chisels, and a vacuum tube;

placing said contacts on a first selected area of said circuit pattern, engaging said chisels with a second selected area between said contacts to cut a chip from said second selected area, placing said vacuum tube in the vicinity of said second selected area to remove said chip.

applying a voltage across said contacts to insure electrical discontinuity in said second selected area;

automatically positioning said first preformed substrate beneath a conductive ribbon dispensing means and punch means;

feeding a portion of an electrically conductive ribbon from said dispensing means to a point directly above one of said holes, depressing said punch means to engage said ribbon and force it from the upper surface of said first preformed substrate through said hole to a point adjacent the lower surface of said preformed substrate, removing said punch means, severing said ribbon from said dispensing means, securing the severed end of said ribbon to said circuit pattern;

placing a bonding material on the upper surface of said circuit pattern on said first preformed substrate;

placing a second preformed substrate over the upper surface of said circuit pattern on said first preformed substrate and aligning the holes in said first and second preformed substrates;

automatically positioning said first and second preformed substrates beneath a conductive ribbon dispensing means and punch means;

feeding a portion of an electrically conductive ribbon from said dispensing means to a point directly above one of said holes in said second preformed substrate, depressing said punch means to engage said ribbon and force it from the upper surface of said second preformed substrate to a point adjacent the lower surface of said first preformed substrate, removing said punch means, severing said ribbon from said dispensing means, securing the severed end of said ribbon to said circuit pattern on said second preformed substrate; and placing said first and second preformed substrates in a press capable of supplying heat and pressure thereto whereby said substrates are securely bonded together.

References Cited

UNITED STATES PATENTS

| | | | |
|---|---|---|---|
| 2,066,876 | 1/1937 | Carpenter et al. | |
| 3,334,275 | 8/1967 | Mandeville | 174—68.5 XR |
| 3,364,300 | 1/1968 | Bradham | 174—68.5 |

DARREL L. CLAY, Primary Examiner

U.S. Cl. X.R.

29—625; 174—68.5; 317—101; 339—17